United States Patent
Kuan et al.

(10) Patent No.: US 7,749,856 B2
(45) Date of Patent: Jul. 6, 2010

(54) METHOD OF FABRICATING STORAGE NODE WITH SUPPORTED STRUCTURE OF STACKED CAPACITOR

(75) Inventors: Shih-Fan Kuan, Taoyuan County (TW); Le-Tien Jung, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 108 days.

(21) Appl. No.: 12/237,382

(22) Filed: Sep. 24, 2008

(65) Prior Publication Data

US 2010/0047992 A1    Feb. 25, 2010

(30) Foreign Application Priority Data

Aug. 25, 2008    (TW) .............................. 97132358 A (51) Int. Cl.
*H01L 21/20* (2006.01)
(52) U.S. Cl. ........................ 438/397; 438/381; 438/389; 257/296; 257/532
(58) Field of Classification Search ................. 438/381, 438/389, 397, 398; 257/296, 532, E21.008
See application file for complete search history.

(56) References Cited

U.S. PATENT DOCUMENTS

| 7,670,903 B2 * | 3/2010 | Park et al. ..................... 438/253 |
| 2008/0173979 A1 * | 7/2008 | Kim ........................... 257/532 |
| 2008/0200024 A1 * | 8/2008 | Kong ........................... 438/636 |

* cited by examiner

*Primary Examiner*—Phuc T Dang
(74) *Attorney, Agent, or Firm*—Winston Hsu (57) ABSTRACT

A method of fabricating a storage node with a supported structure is provided. A dielectric stacked comprising an etch stop layer, a first dielectric layer, a support layer and a second dielectric layer is formed on a substrate. An opening is etched into the dielectric stacked. A conductive layer is formed on the second dielectric layer and inside the opening. The conductive layer directly above the second dielectric layer is removed to form columnar node structure. The second dielectric layer is then removed. A spacer layer is deposited on the support layer and the columnar node structure. A tilt-angle implant is performed to implant dopants into the spacer layer. The undoped spacer layer is removed to form a hard mask. The support layer not covered by the hard mask is etched away to expose the first dielectric layer. The first dielectric layer and the hard mask are removed.

17 Claims, 14 Drawing Sheets

METHOD OF FABRICATING STORAGE NODE WITH SUPPORTED STRUCTURE OF STACKED CAPACITOR

BACKGROUND OF THE INVENTION

1. Field of the Invention

The present invention relates generally to semiconductor technology. More particularly, the present invention relates to an improved method of fabricating a storage node with a supported structure of a stacked capacitor device.

2. Description of the Prior Art

It has been the trend to scale down the sizes of memory cells to increase the integration level and thus memory capacity of a DRAM chip. As the sizes of DRAM devices are decreased, the capacity of the capacitors in the DRAM devices is correspondingly decreased. One approach to increasing capacity of the capacitor involves increasing the surface area of the storage node. As known in the art, the surface area of a storage node in a capacitor-over-bit-line (COB) structure is mostly increased by increasing the height since the design rule limits the horizontal dimension of the storage node. However, a higher storage node height causes instability of storage node structure, which is the cause of device failure due to two-bit or multi-bit failure during DRAM operation.

Figure 1:
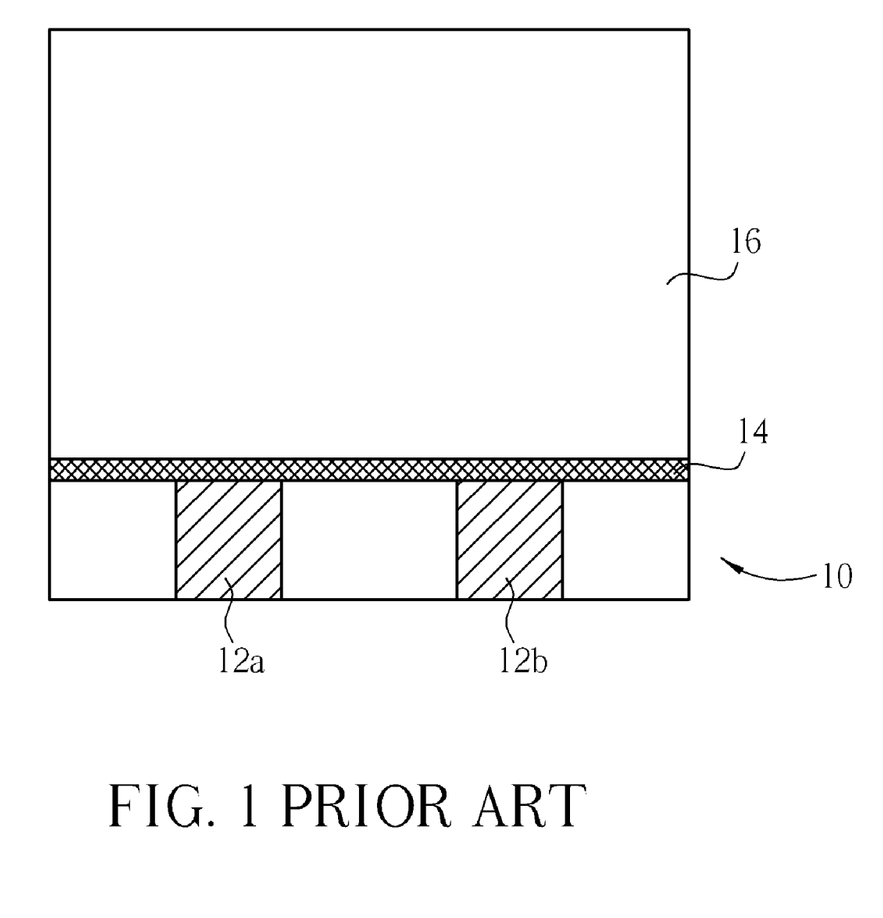
FIGS. 1-5 are schematic, cross-sectional diagrams showing a conventional method for fabricating a storage node of a crown-type stacked cell capacitor.

FIGS. 1-5 are schematic, cross-sectional diagrams showing a conventional method for fabricating a storage node of a crown-type stacked cell capacitor. As shown in FIG. 1, a substrate 10 such as a silicon substrate having thereon conductive blocks 12a and 12b is provided. A dielectric layer 14 such as silicon nitride and a dielectric layer 16 such as undoped silicate glass (USG) are deposited over the substrate 10.

Figure 2:
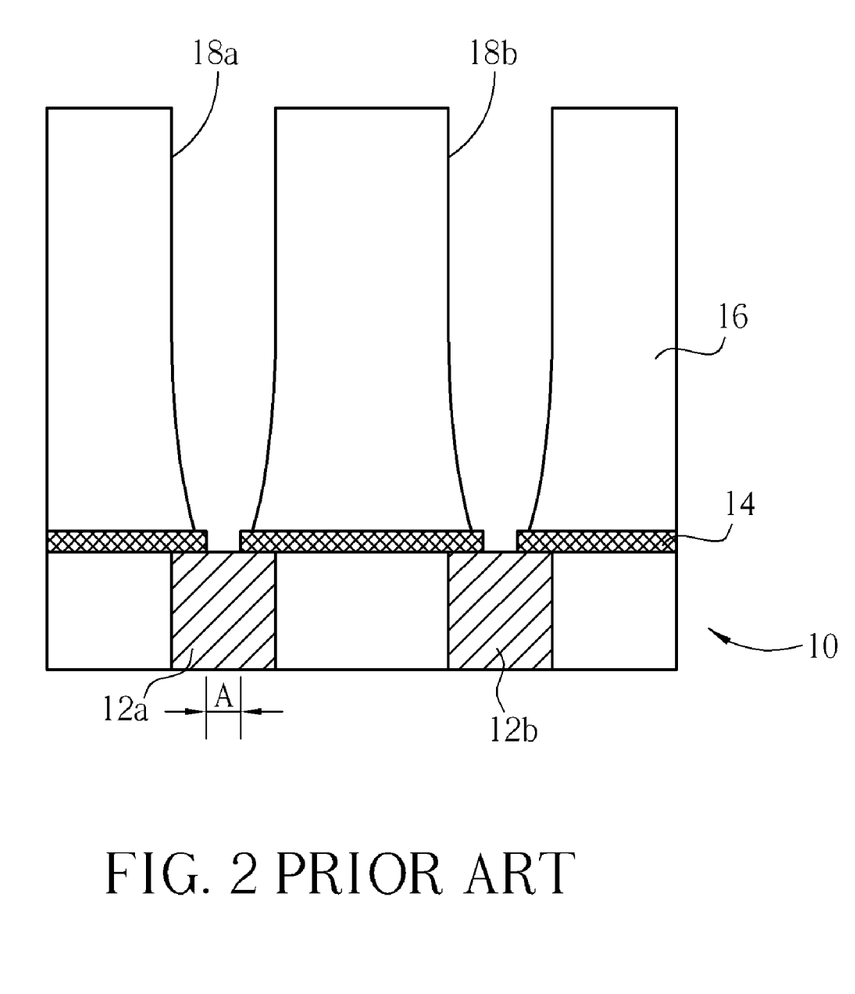

As shown in FIG. 2, a conventional lithographic process and a dry etching process are carried out to etch high aspect ratio openings 18a and 18b into the dielectric layers 14 and 16. Subsequently, a cleaning process may be performed to remove the etching byproducts or particles from the surfaces of the substrate 10 and from the interior surfaces of the openings 18a and 18b.

Figure 3:
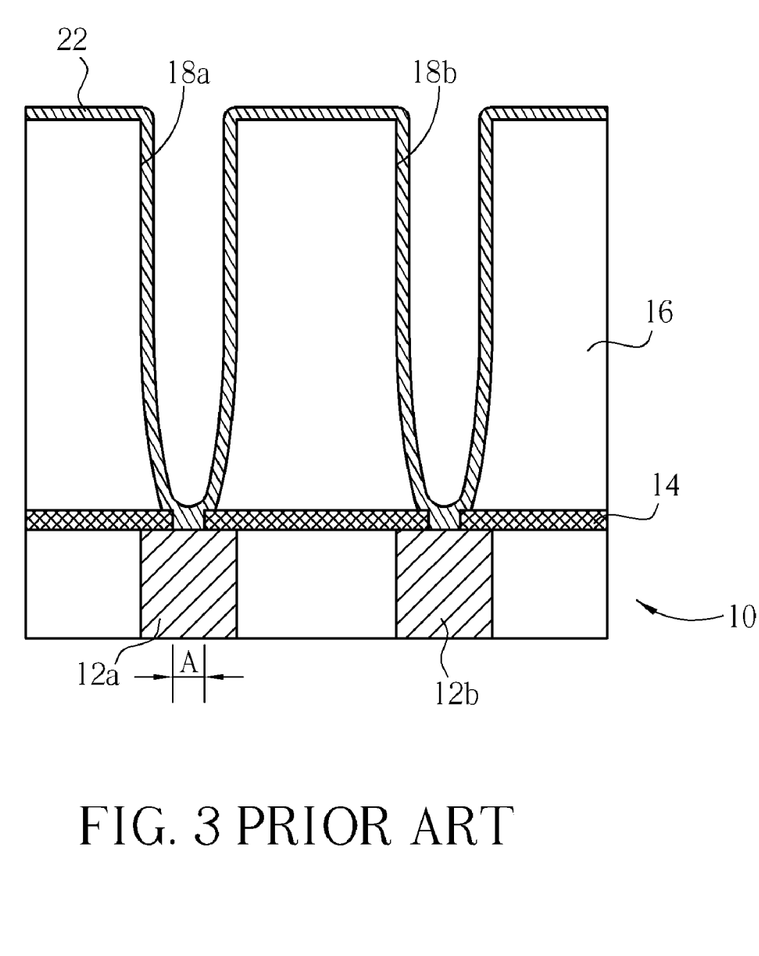

As shown in FIG. 3, a chemical vapor deposition (CVD) process is carried out to form a conformal silicon layer 22 on the surface of the dielectric layer 16 and on the interior surfaces of the openings 18a and 18b. The silicon layer 22 may be doped polysilicon.

Figure 4:
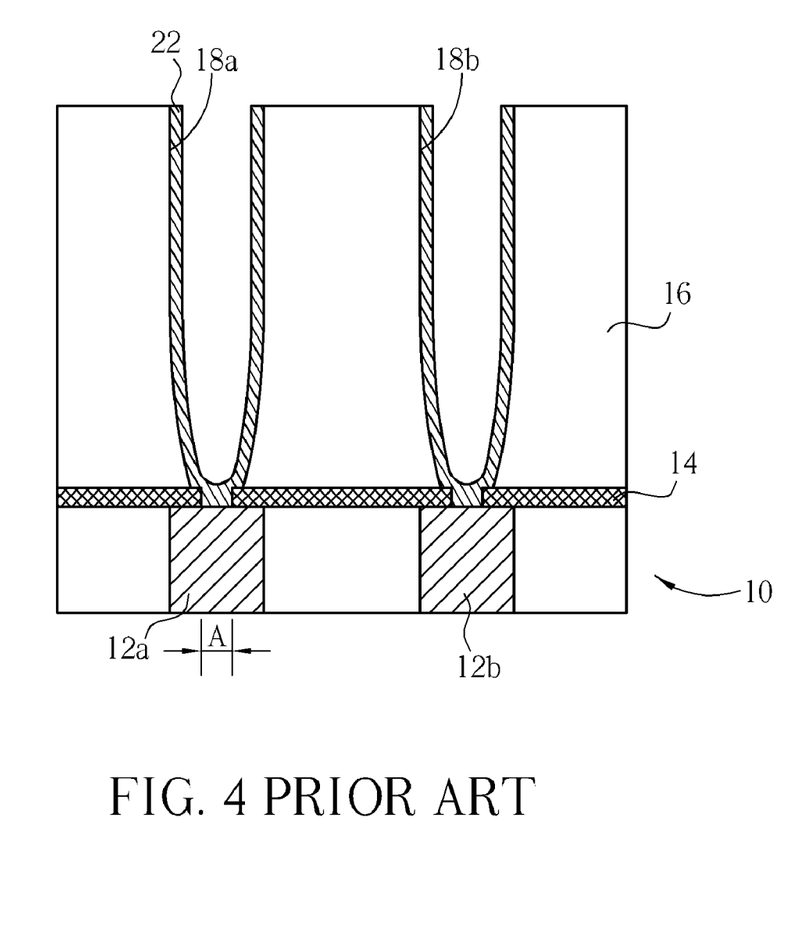

As shown in FIG. 4, a planarization process such as chemical mechanical polishing (CMP) is performed to selectively remove the silicon layer 22 from the surface of the dielectric layer 16, while leaving the silicon layer 22 on the interior surfaces of the openings 18a and 18b intact.

Figure 5:
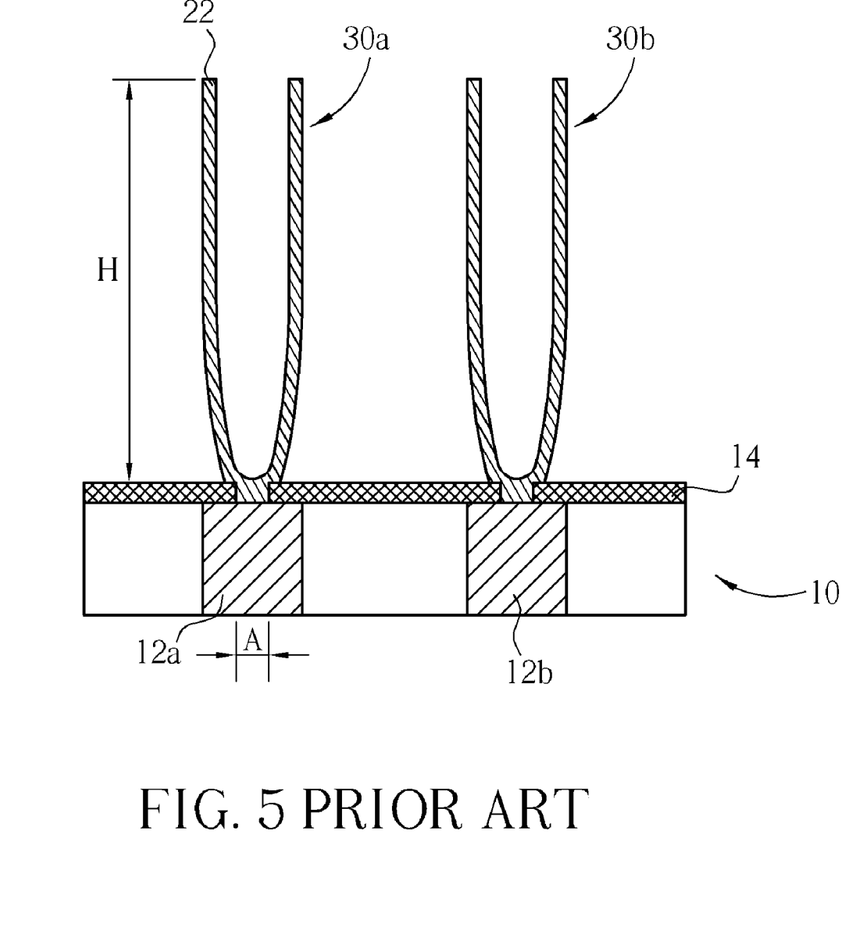

Subsequently, as shown in FIG. 5, a wet etching process involving the use of HF/NH$_4$F chemistry or Buffer Oxide Etcher (BOE) is performed to remove the dielectric layer 16, thereby forming storage nodes 30a and 30b. Typically, the height H of the storage nodes 30a and 30b is approximately equal to the depth of the openings 18a and 18b, which is normally 1.6-1.7 micrometers.

One drawback of the above-mentioned prior art method is that when etching the high aspect ratio openings 18a and 18b it is difficult to obtain a straight sidewall profile. The tapered sidewall profile of the high aspect ratio openings 18a and 18b leads to small bottom critical dimension A. The small bottom critical dimension A results in so-called storage node bridge phenomenon during subsequent cleaning or drying processes.

SUMMARY OF THE INVENTION

It is one object of the present invention to provide an improved method of fabricating a storage node of a stacked capacitor in order to increase the stability of the storage node structure, thereby preventing the storage node bridge phenomenon.

To these ends, according to one aspect of the present invention, there is provided a method of fabricating a storage node of a stacked capacitor, comprising providing a substrate having thereon a conductive block; forming a stacked structure on the substrate, the stacked structure comprising at least a first dielectric layer on the substrate, a supporting layer on the first dielectric layer and a second dielectric layer on the supporting layer; forming an opening in the stacked structure to expose a portion of the conductive block; forming a storage node layer on sidewall and bottom of the opening; removing the second dielectric layer to expose the supporting layer; conformally forming a spacer layer on the supporting layer and on the storage node layer; performing an ion implantation process to implant dopants into portions of the spacer layer; selectively removing the spacer layer that is not implanted by the dopants and the remanent spacer layer acting as a hard mask layer when removing portions of the supporting layer thereby exposing portions of the first dielectric layer; and completely removing the first dielectric layer and the hard mask layer.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
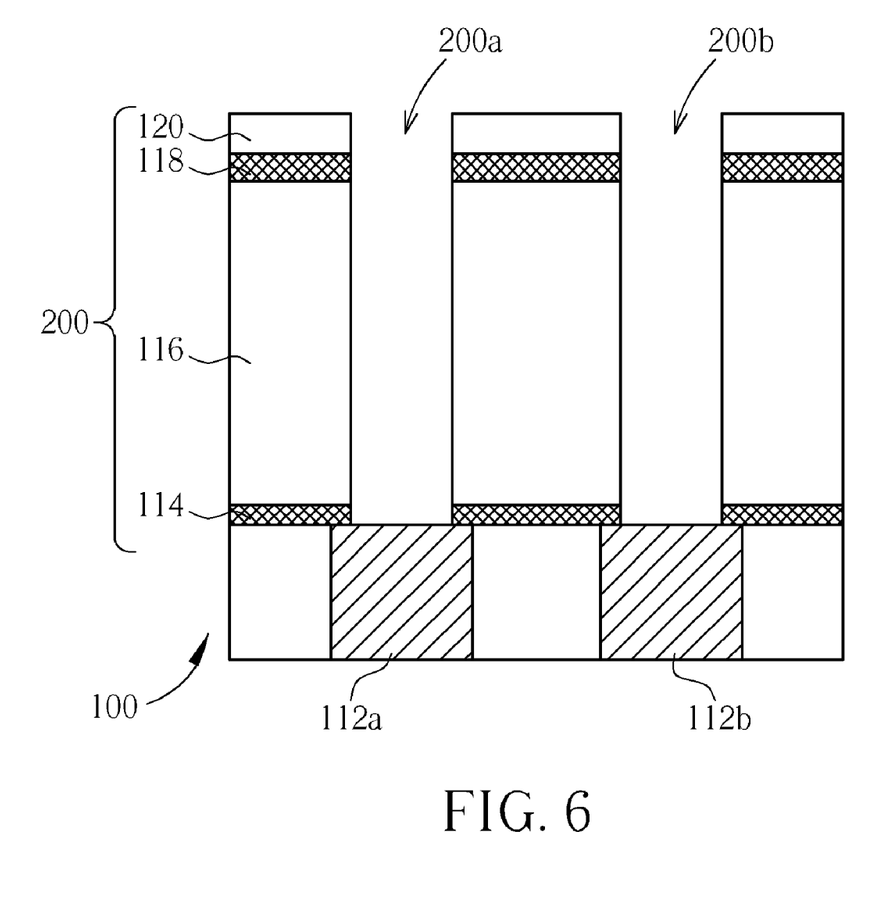
FIGS. 6-13 are schematic, cross-sectional diagrams showing an improved method for fabricating a storage node of a crown-type stacked cell capacitor in accordance with one preferred embodiment of this invention.

Please refer to FIG. 6 to FIG. 13. FIGS. 6-13 are schematic, cross-sectional diagrams showing an improved method for fabricating a storage node of a crown-type stacked cell capacitor in accordance with one preferred embodiment of this invention. As shown in FIG. 6, a substrate 100 such as a silicon substrate having thereon conductive blocks 112a and 112b is provided. An etch stop layer 114 such as silicon nitride and a dielectric layer 116 such as USG or BSG are deposited over the substrate 100. A supporting layer 118 such as silicon nitride is deposited on the dielectric layer 116. A dielectric layer 120 such as USG or BSG is deposited on the supporting layer 118. Preferably, the dielectric layer 116 has a thickness of about 1.5-2.5 μm. The dielectric layer 120 has a thickness of about 500-4000 angstroms.

The etch stop layer 114, the dielectric layer 116, the supporting layer 118 and the dielectric layer 120 constitute a dielectric stacked structure 200 on the substrate 100. Subsequently, a conventional lithographic process and an etching process are carried out to etch high aspect ratio openings 200a and 200b into the dielectric stacked structure 200. The high aspect ratio openings 200a and 200b exposes portions of the conductive blocks 112a and 112b respectively.

Figure 7:
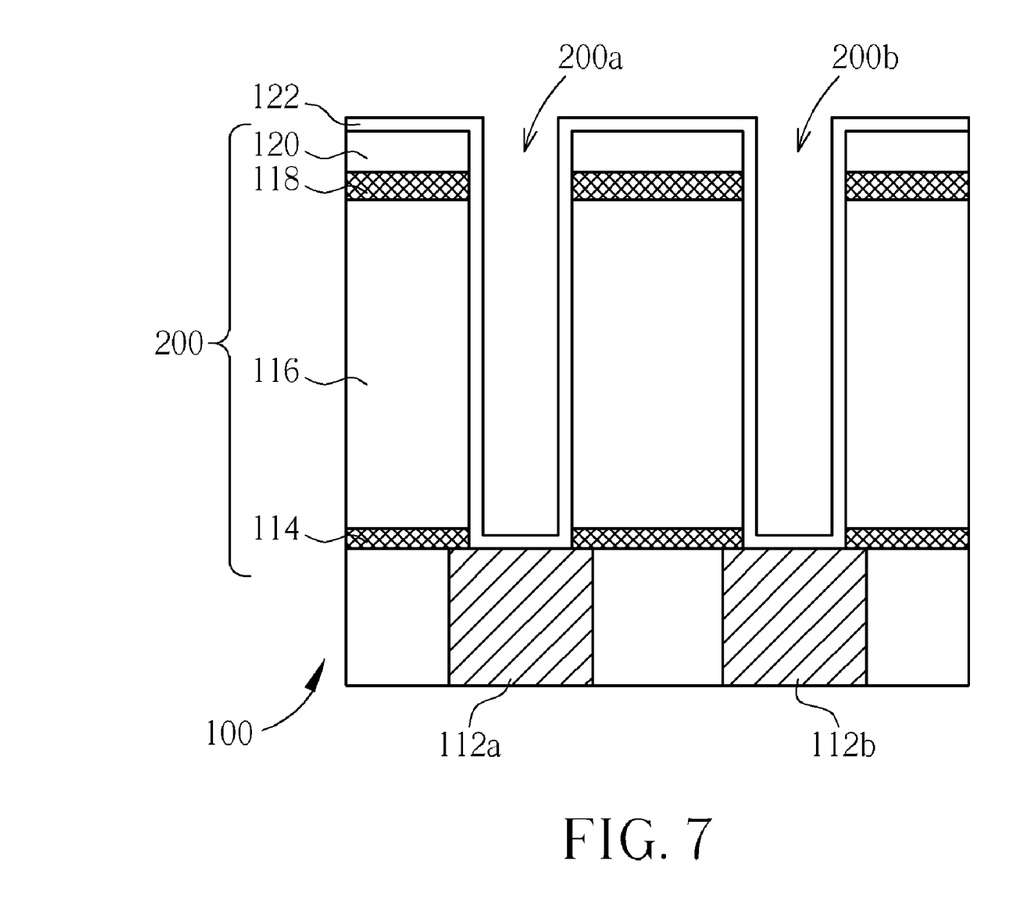

As shown in FIG. 7, a chemical vapor deposition (CVD) process is carried out to form a conformal conductive layer 122 such as metal on the surface of the dielectric layer 120 and on the interior surfaces of the openings 200a and 200b. According to this invention, the conductive layer 122 is preferably titanium nitride, but not limited thereto.

Figure 8:
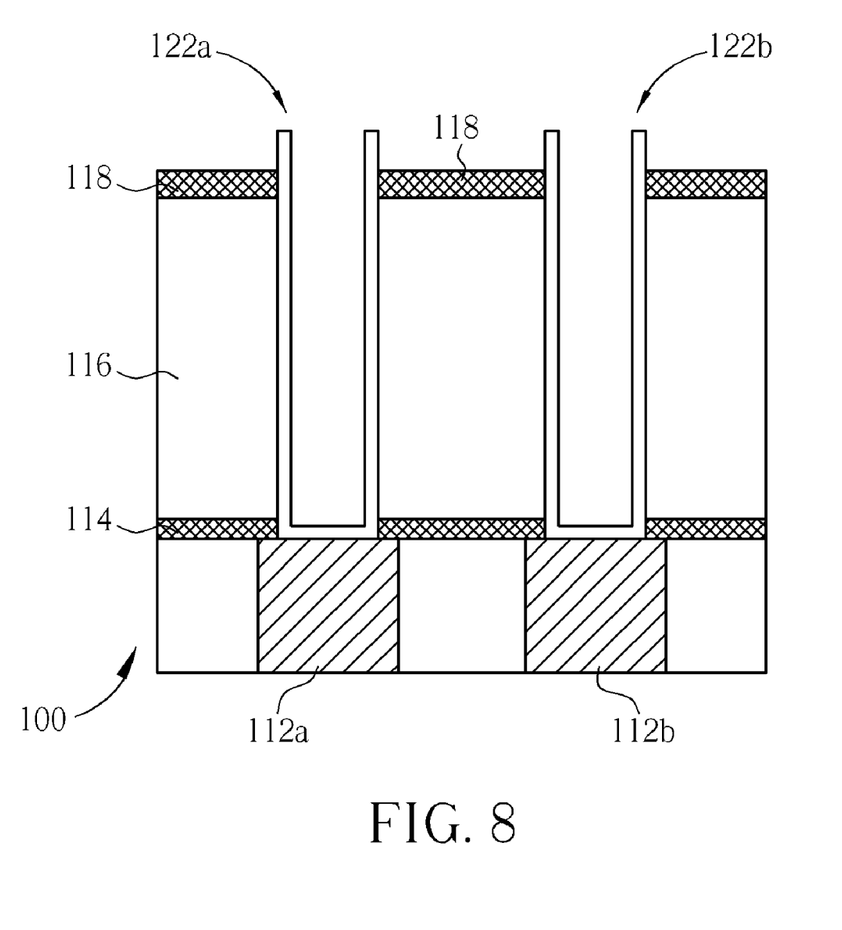

As shown in FIG. 8, the conductive layer 122 situated directly above the dielectric layer 120 is selectively removed from the surface of the dielectric layer 120, while leaving the conductive layer 122 on the interior surfaces of the openings 200a and 200b intact, forming independent, columnar storage node 122a and 122b. At this point, the surface of the dielectric layer 120 is exposed.

For example, the conductive layer 122 situated directly above the dielectric layer 120 may be selectively removed using the following steps: filling the openings 200a and 200b with an intermediate sacrificial layer (not shown) such as photoresist or silicon oxide, chemical mechanically polishing away the conductive layer 122 from the surface of the dielectric layer 122, then removing the intermediate sacrificial layer.

After the removal of the conductive layer 122 on the dielectric layer 120, the dielectric layer 120 is selectively removed to expose the supporting layer 118. At this point, the top portions of the columnar storage node 122a and 122b protrude from a surface of the supporting layer 118.

Figure 9:
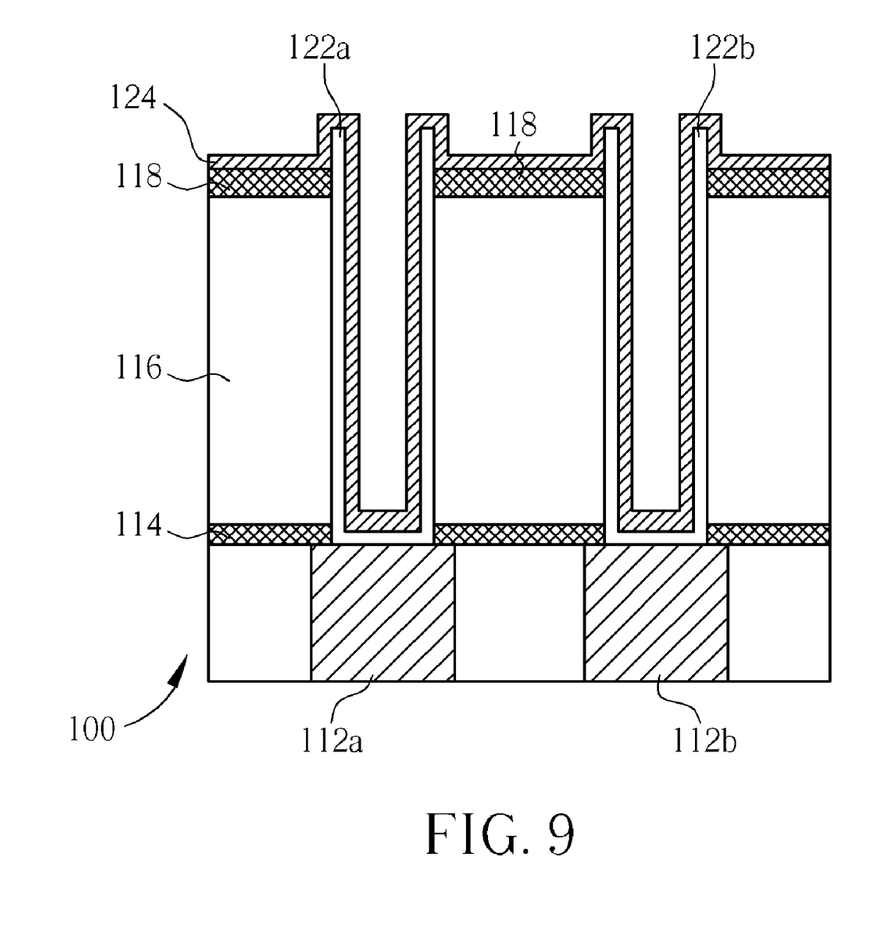

As shown in FIG. 9, a CVD process is performed to deposit a spacer layer 124 on the surface of the supporting layer 118 and on the surface of the columnar storage node 122a and 122b. Preferably, the spacer layer 124 has a thickness ranging between 50 angstroms and 600 angstroms.

According to the preferred embodiment of this invention, the spacer layer 124 is made of polysilicon. However, it is to be understood that the spacer layer 124 may be made of silicon dioxide or any other suitable materials in other embodiments without departing from the scope and spirit of the present invention.

Figure 10:
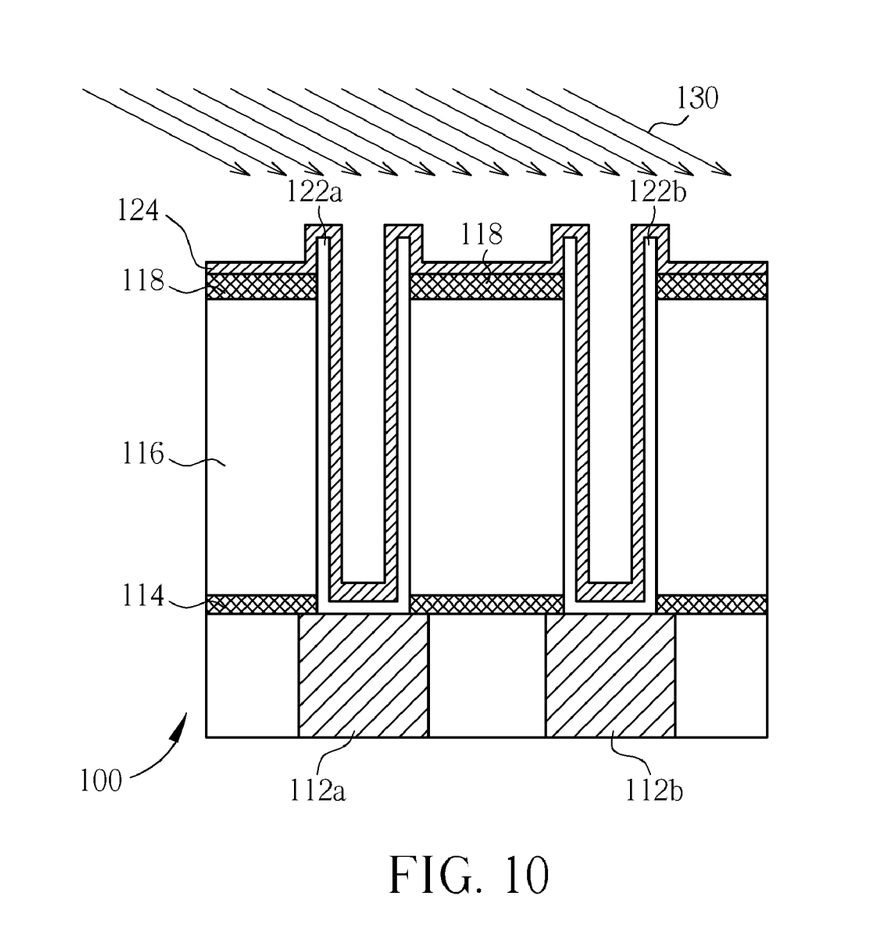

As shown in FIG. 10, thereafter, a tilt angle ion implantation process 130 is carried out to selectively implant dopants such as BF2 or argon into the spacer layer 124. Of course, multiple tilt angle ion implantation steps may be performed at this stage depending on the layout of the stacked capacitor and the design of the supporting structure.

Figure 11:
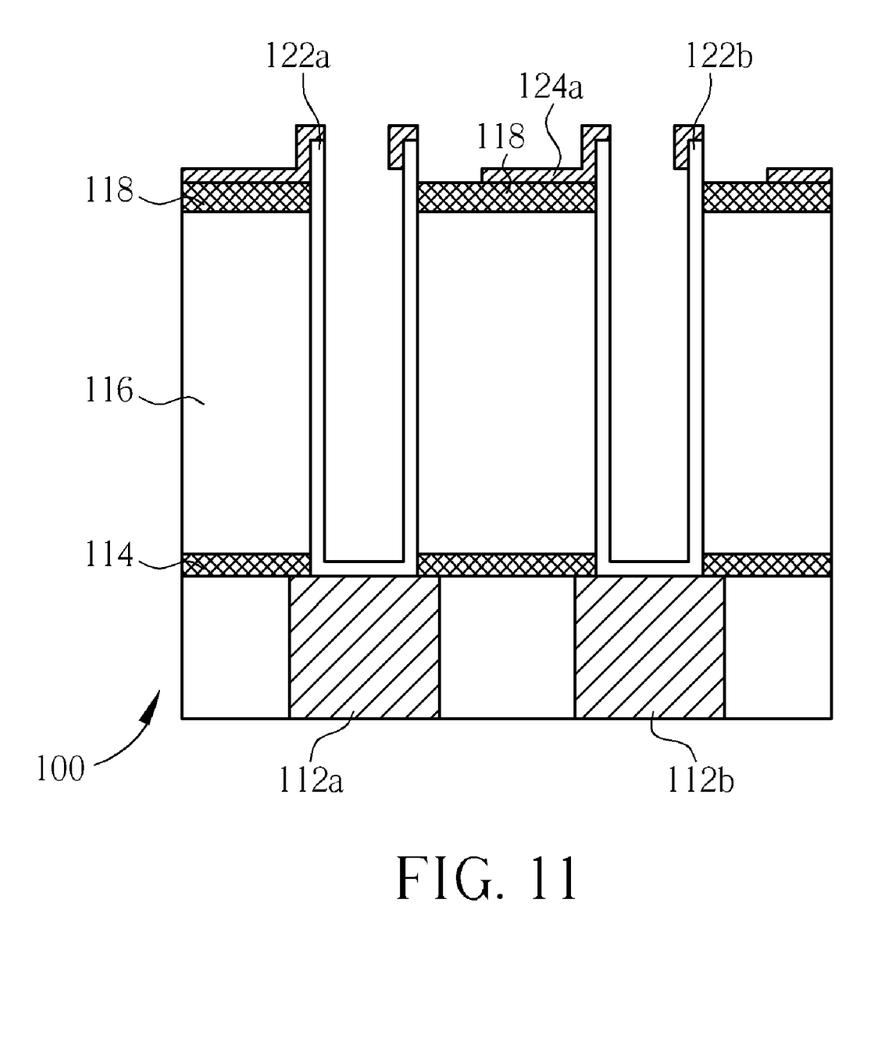

As shown in FIG. 11, a wet etching process is then performed to selectively remove portions of the spacer layer 124 that are not implanted by dopants. After selectively removing the spacer layer 124, portions of the supporting layer 118 and portions of the columnar storage node 122a and 122b are exposed. The remanent spacer layer 124 constitutes a hard mask layer 124a.

Figure 12:
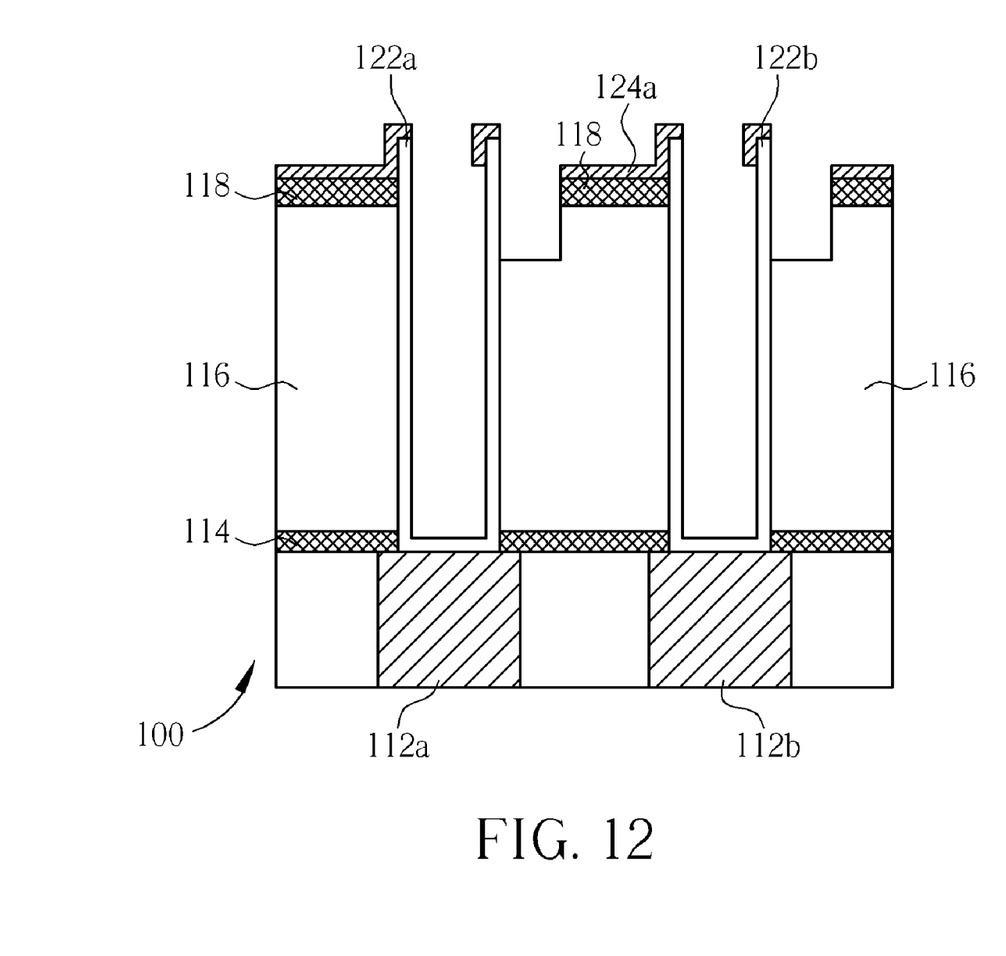

As shown in FIG. 12, using the hard mask layer 124a as an etching mask, a dry etching process is performed to etch through the supporting layer 118 that is not covered by the hard mask layer 124a, thereby exposing portions of the dielectric layer 116.

Figure 13:
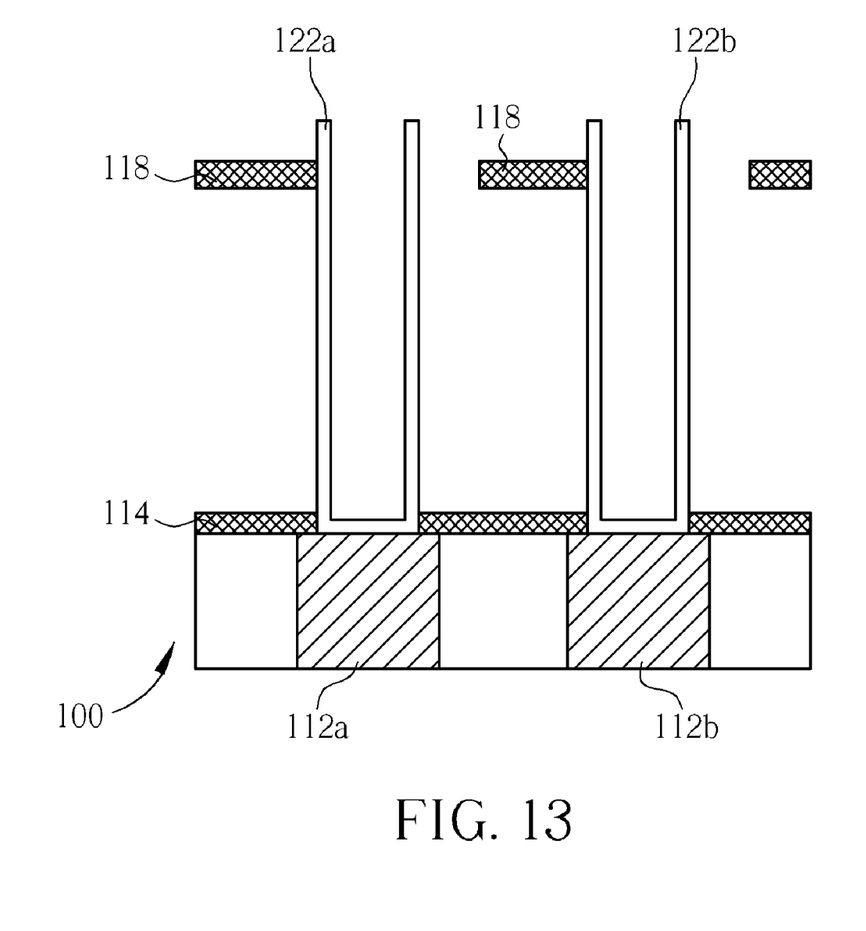
Figure 14:
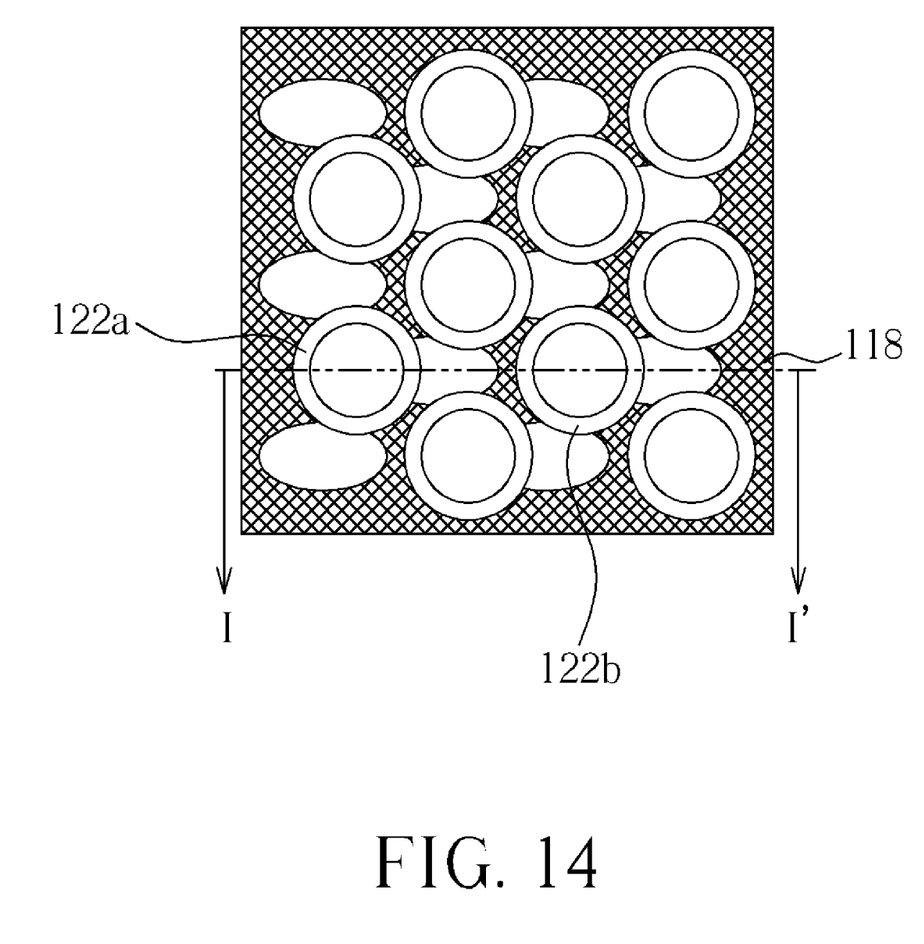
FIG. 14 is an aerial view of the columnar storage nodes and the supporting layer.

As shown in FIG. 13, a wet etching process is then performed to completely remove the dielectric layer 116 and the hard mask layer 124a, but leaving the columnar storage node 122a and 122b and the supporting layer 118. The aerial view of the columnar storage node 122a and 122b and the supporting layer 118 after the removal of the dielectric layer 116 and the hard mask layer 124a is shown in FIG. 14, wherein FIG. 13 is the cross-sectional view taken along line I-I' of the FIG. 14.

Those skilled in the art will readily observe that numerous modifications and alterations of the device and method may be made while retaining the teachings of the invention.

What is claimed is:

1. A method of fabricating a storage node with a supported structure, comprising the steps of:
   providing a substrate having a conductive block therein;
   forming a stacked structure on the substrate, the stacked structure comprising at least a first dielectric layer on the substrate, a supporting layer on the first dielectric layer and a second dielectric layer on the supporting layer;
   forming an opening in the stack structure to expose a portion of the conductive block;
   forming a storage node layer on sidewall of the opening and covering the exposed conductive block;
   removing the second dielectric layer to expose the supporting layer;
   conformally forming a spacer layer on the supporting layer and on the storage node layer;
   selectively removing a portion of the spacer layer to expose portions of the supporting layer;
   removing portions of the supporting layer to expose portions of the first dielectric layer; and
   completely removing the first dielectric layer and rest of the spacer layer such that the storage node with a supported structure is formed.

2. The method according to claim 1 wherein the stacked structure comprises an etch stop layer formed between the first dielectric layer and the substrate.

3. The method according to claim 2 wherein the first dielectric layer and the hard mask layer are removed by wet etching.

4. The method according to claim 2 wherein a material of the etch stop layer comprises silicon nitride.

5. The method according to claim 1 wherein a material of the etch stop layer comprises silicon nitride.

6. The method according to claim 1 wherein the first dielectric layer comprises undoped silicate glass (USG) or BSG.

7. The method according to claim 1 wherein a material of the supporting layer comprises silicon nitride.

8. The method according to claim 1 wherein the second dielectric layer comprises USG or BSG.

9. The method according to claim 1 wherein the conductive block comprises metal.

10. The method according to claim 9 wherein the metal comprises titanium nitride.

11. The method according to claim 1 wherein a material of the spacer layer comprises polysilicon.

12. The method according to claim 1 wherein the spacer layer comprises silicon dioxide.

13. The method according to claim 1 wherein the spacer layer selectively removing step comprises removing non-implanted portions of the spacer layer.

14. The method according to claim 1 wherein portions of the supporting layer removing step comprises using rest of the spacer layer as a hard mask to remove the exposed supporting layer.

15. The method according to claim 2 further comprising performing an ion implantation process to implant dopants into portions of the spacer layer so that the spacer layer is able to be selectively removed, wherein the spacer layer selectively removing step comprises removing non-implanted portions of the spacer layer.

16. The method according to claim 2 wherein portions of the supporting layer removing step comprises using rest of the spacer layer as a hard mask to remove the exposed supporting layer.

17. The method according to claim 15 wherein portions of the supporting layer removing step comprises using rest of the spacer layer as a hard mask to remove the exposed supporting layer.

* * * * *